United States Patent
Ishizaka (10) Patent No.: US 7,407,876 B2
(45) Date of Patent: *Aug. 5, 2008

(54) METHOD OF PLASMA ENHANCED ATOMIC LAYER DEPOSITION OF TAC AND TACN FILMS HAVING GOOD ADHESION TO COPPER

(75) Inventor: Tadahiro Ishizaka, Watervliet, NY (US)

(73) Assignee: Tokyo Electron Limited, Tokyo (JP)

( * ) Notice: Subject to any disclaimer, the term of this patent is extended or adjusted under 35 U.S.C. 154(b) by 125 days.

This patent is subject to a terminal disclaimer.

(21) Appl. No.: 11/378,271

(22) Filed: Mar. 20, 2006

(65) Prior Publication Data

US 2007/0218670 A1  Sep. 20, 2007

(51) Int. Cl.
  *H01L 21/44* (2006.01)
  *H01L 21/4763* (2006.01)
(52) U.S. Cl. .................. 438/597; 438/618; 438/648; 438/680; 257/E21.17; 257/E21.171; 257/E21.168
(58) Field of Classification Search .............. 438/597, 438/618, 648, 680; 118/715; 257/E21.17, 257/E21.171, E21.168
See application file for complete search history.

(56) References Cited

U.S. PATENT DOCUMENTS

| | | | |
|---|---|---|---|
| 6,593,484 B2 | 7/2003 | Yasuhara et al. | |
| 7,186,446 B2 * | 3/2007 | Kim et al. | 427/569 |
| 2002/0192952 A1 | 12/2002 | Itoh et al. | |
| 2006/0210723 A1 * | 9/2006 | Ishizaka | 427/569 |
| 2006/0211223 A1 * | 9/2006 | Brcka | 438/493 |
| 2006/0211224 A1 * | 9/2006 | Matsuda | 438/493 |
| 2006/0211243 A1 * | 9/2006 | Ishizaka et al. | 438/680 |
| 2006/0211246 A1 * | 9/2006 | Ishizaka et al. | 438/685 |
| 2006/0213437 A1 * | 9/2006 | Ishizaka et al. | 118/715 |
| 2006/0213439 A1 * | 9/2006 | Ishizaka | 118/715 |

OTHER PUBLICATIONS

Kim, J.Y., et al., "Basic characteristics of TaN films deposited by using the remote plasma enhanced atomic layer deposition method," Journal of the Korean Physical Society, Oct. 2004, vol. 45, No. 4, pp. 1069-1073.

Park, J.S. et al., "Plasma-enhanced atomic layer deposition of tantalum nitrides using hydrogen radicals as a reducing agent," Electrochemical and Solid-State Letters, 2001, vol. 4, No. 4, pp. C17-C19.

* cited by examiner

*Primary Examiner*—Scott B. Geyer
*Assistant Examiner*—Mohsen Ahmadi
(74) *Attorney, Agent, or Firm*—Oblon, Spivak, McClelland, Maier & Neustadt, P.C.

(57) ABSTRACT

A method for processing a substrate for forming TaC and TaCN films having good adhesion to Cu. The method includes disposing the substrate in a process chamber of a plasma enhanced atomic layer deposition (PEALD) system configured to perform a PEALD process, and depositing a TaC or TaCN film on the substrate using the PEALD process. The PEALD process includes (a) exposing the substrate to a first process material containing tantalum, (b) exposing the substrate to a second process material containing a plasma excited reducing agent, (c) repeating steps (a) (b) a predetermined number of times, (d) exposing the substrate to plasma excited Argon, and (e) repeating steps (c) and (d) until the TaC or TaCN film has a desired thickness. Preferably, purging of the process chamber is performed after one or more of the exposing steps.

27 Claims, 5 Drawing Sheets

METHOD OF PLASMA ENHANCED ATOMIC LAYER DEPOSITION OF TAC AND TACN FILMS HAVING GOOD ADHESION TO COPPER

FIELD OF INVENTION

The present invention relates to a plasma enhanced atomic layer deposition system and a method of operating thereof, and more particularly to a method of forming a TaC or TaCN film having good adhesion to Cu.

BACKGROUND OF THE INVENTION

Typically, during materials processing, plasma is employed to facilitate the addition and removal of material films when fabricating composite material structures. For example, in semiconductor processing, a (dry) plasma etch process is utilized to remove or etch material along fine trenches or within vias or contacts patterned on a silicon substrate. Alternatively, for example, a vapor deposition process is utilized to deposit material along fine lines or within vias or contacts on a silicon substrate. In the latter, vapor deposition processes include chemical vapor deposition (CVD), and plasma enhanced chemical vapor deposition (PECVD).

In PECVD, plasma is utilized to alter or enhance the film deposition mechanism. For instance, plasma excitation generally allows film-forming reactions to proceed at temperatures that are significantly lower than those typically required to produce a similar film by thermally excited CVD. In addition, plasma excitation may activate film-forming chemical reactions that are not energetically or kinetically favored in thermal CVD. The chemical and physical properties of PECVD films may thus be varied over a relatively wide range by adjusting process parameters.

More recently, atomic layer deposition (ALD), a form of CVD or more generally film deposition, has emerged as a candidate for ultra-thin gate film formation in front end-of-line (FEOL) operations, as well as ultra-thin barrier layer and seed layer formation for metallization in back end-of-line (BEOL) operations. In ALD, two or more process gases are introduced alternately and sequentially in order to form a material film one monolayer (or less) at a time. Such an ALD process has proven to provide improved uniformity and control in layer thickness, as well as conformality to features on which the layer is deposited. However, current ALD processes often suffer from contamination problems that affect the quality of the deposited ALD films, and the interfaces between the ALD films and other films in a manufactured device.

The introduction of copper (Cu) metal into multilayer metallization schemes for manufacturing integrated circuits can necessitate the use of diffusion barriers/liners to promote adhesion and growth of the Cu layers and to prevent diffusion of Cu into the dielectric materials. Barriers/liners that are deposited onto dielectric materials can include refractive materials, such as tungsten (W), molybdenum (Mo), and tantalum (Ta), that are non-reactive and immiscible in Cu, and can offer low electrical resistivity. For example, Cu integration schemes for technology nodes less than or equal to 130 nm can utilize a low dielectric constant (low-k) inter-level dielectric, followed by a physical vapor deposition (PVD) of a Ta film or a TaN/Ta film, followed by a PVD Cu seed layer, and an electro-chemical deposition (ECD) Cu fill. Generally, Ta films are chosen for their adhesion properties (i.e., their ability to adhere on low-k films), and TaN/Ta films are generally chosen for their barrier properties (i.e., their ability to prevent Cu diffusion into the low-k film).

The presence of impurities in Ta-containing films can result in weak adhesion between a bulk Cu layer and the Ta-containing films, which in turn can result in electro-migration (EM) and stress migration (SM) problems, as well as reduced device production yields. Thus, new processing methods are needed for improving the properties and integration of Ta-containing films into Cu metallization schemes.

SUMMARY OF THE INVENTION

Accordingly, one object of the present invention is directed to improving the properties and integration of Ta-containing films with Cu layers in Cu metallization.

Another object of the present invention is to deposit a TaC or a TaCN film by plasma enhanced atomic layer deposition (PEALD) that has good adhesion to Cu layers.

According to one embodiment of the invention, a method is provided for processing a substrate, the method including disposing the substrate in a process chamber of a PEALD system configured to perform a PEALD process, and depositing a TaC or TaCN film on the substrate using the PEALD process. The PEALD process includes (a) exposing the substrate to a first process material containing tantalum, (b) exposing the substrate to a second process material containing a plasma excited reducing agent, (c) repeating steps (a) and (b) a predetermined number of times, (d) exposing the substrate to plasma excited Argon, and (e) repeating steps (c) and (d) until the TaC or TaCN film has a desired thickness.

According to another embodiment of the invention, a method is provided for processing a substrate, the method including disposing the substrate in a process chamber of a PEALD system configured to perform a PEALD process, and depositing a TaCN film on the substrate using the PEALD process. The PEALD process includes (a) exposing the substrate to a first process material comprising TAIMATA (tertiary amyl imido-tris-dimethylamido tantalum, $Ta(NC(CH_3)_2C_2H_5)(N(CH_3)_2)_3$) in the absence of a plasma, (b) purging the PEALD chamber of the first process material, (c) exposing the substrate to a second process material comprising plasma excited $H_2$, (d) purging the process chamber of the second process material, (e) repeating steps (a)-(d) a desired number of times, (f) exposing the substrate to plasma excited Argon, and (g) repeating steps (a)-(J) until the TaCN film has a desired thickness.

DETAILED DESCRIPTION OF SEVERAL EMBODIMENTS

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Figure 1:
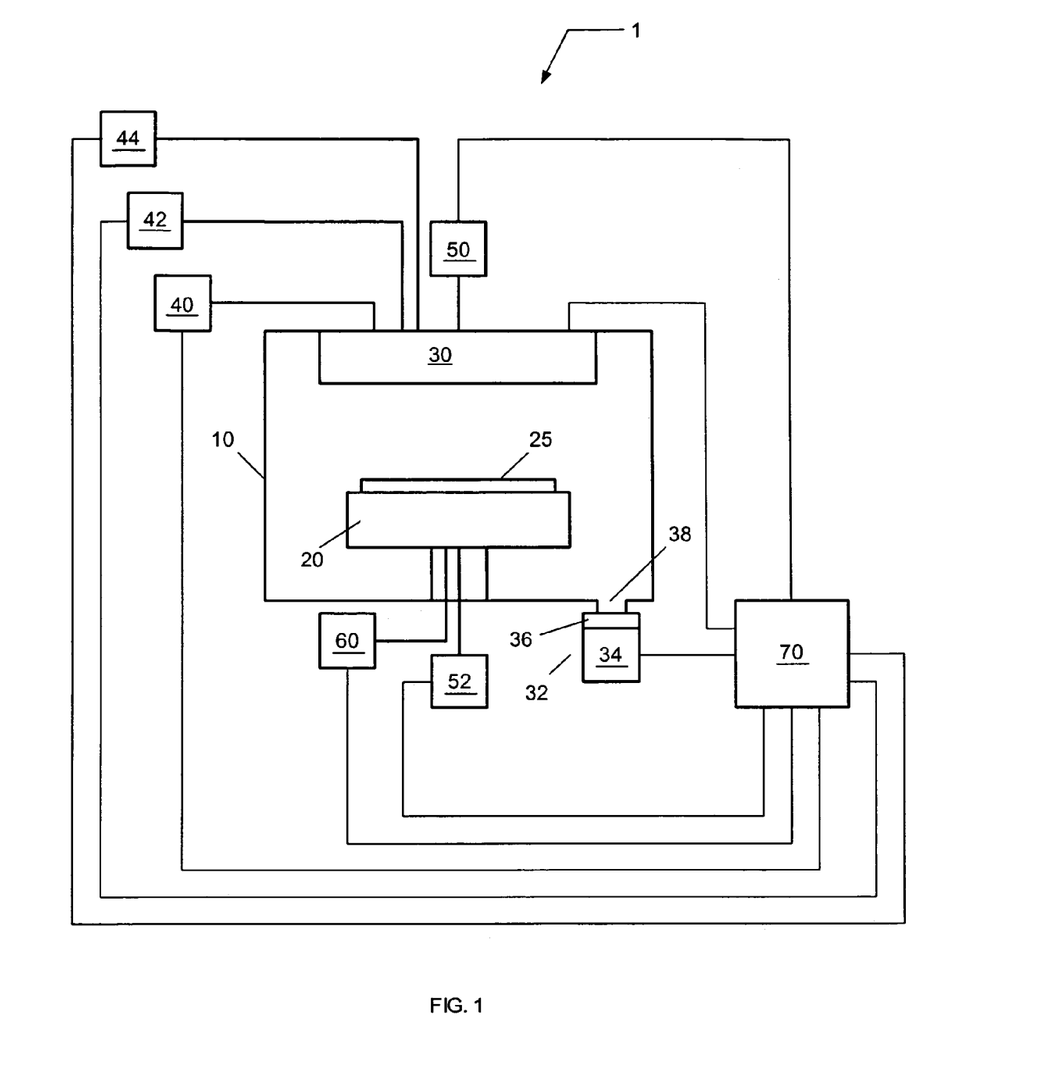
FIG. 1 depicts a schematic view of a PEALD system in accordance with an embodiment of the invention.

Referring now to the drawings, FIG. 1 illustrates a PEALD system 1 for depositing a thin TaC or TaCN film on a substrate according to one embodiment of the invention. For example, during the metallization of inter-connect and intra-connect structures for semiconductor devices in back-end-of-line (BEOL) operations, a thin conformal TaC or TaCN film may be deposited on wiring trenches or vias to minimize the migration of metal into the inter-level or intra-level dielectric, where the TaC or TaCN film provides acceptable adhesion to the dielectric and a Cu seed layer deposited on the TaCN film for subsequent metallization.

The PEALD system 1 comprises a process chamber 10 having a substrate holder 20 configured to support a substrate 25, upon which the thin TaC or TaCN film is formed. The process chamber 10 further comprises an upper assembly 30 coupled to a first process material supply system 40, a second process material supply system 42, and a purge gas supply system 44. Additionally, the PEALD system 1 includes a first power source 50 coupled to the process chamber 10 and configured to generate plasma in the process chamber 10, and a substrate temperature control system 60 coupled to substrate holder 20 and configured to elevate and control the temperature of substrate 25. Additionally, the PEALD system 1 includes a controller 70 that can be coupled to process chamber 10, substrate holder 20, upper assembly 30, first process material supply system 40, second process material supply system 42, purge gas supply system 44, first power source 50, and substrate temperature control system 60.

Alternatively, or in addition, controller 70 can be coupled to one or more additional controllers/computers (not shown), and controller 70 can obtain setup and/or configuration information from an additional controller/computer.

In FIG. 1, singular processing elements (10, 20, 30, 40, 42, 44, 50, and 60) are shown, but this is not required for the invention. The PEALD system 1 can include any number of processing elements having any number of controllers associated with them in addition to independent processing elements.

The controller 70 can be used to configure any number of processing elements (10, 20, 30, 40, 42, 44, 50, and 60), and the controller 70 can collect, provide, process, store, and display data from processing elements. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements.

Still referring to FIG. 1, the PEALD system 1 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Therefore, while aspects of the invention will be described in connection with the processing of a semiconductor substrate, the invention is not limited solely thereto.

The first process material supply system 40 and the second process material supply system 42 are configured to alternately introduce a first process material to process chamber 10 and a second process material to process chamber 10. The alternation of the introduction of the first material and the introduction of the second material can be cyclical, or it may be acyclical with variable time periods between introduction of the first and second materials. The first process material can, for example, comprise a TaC or TaCN film precursor, such as a composition having the principal atomic or molecular species found in the TaC or TaCN film formed on substrate 25. For instance, the TaC or TaCN film precursor can originate as a solid phase, a liquid phase, or a gaseous phase, and it may be delivered to process chamber 10 in a gaseous phase with or without the use of a carrier gas. The second process material can, for example, comprise a reducing agent, which may also include atomic or molecular species found in the film formed on substrate 25. For instance, the reducing agent can originate as a solid phase, a liquid phase, or a gaseous phase, and it may be delivered to process chamber 10 in a gaseous phase with or without the use of a carrier gas.

Additionally, the purge gas supply system 44 can be configured to introduce a purge gas to process chamber 10. For example, the introduction of purge gas may occur between introduction of the first process material and the second process material to process chamber 10, or following the introduction of the second process material to process chamber 10, respectively. The purge gas can comprise an inert gas, such as a noble gas (i.e., helium, neon, argon, xenon, krypton), or nitrogen ($N_2$), or hydrogen ($H_2$).

Referring still to FIG. 1, the PEALD system 1 includes a plasma generation system configured to generate a plasma during at least a portion of the alternating introduction of the first process material and the second process material to process chamber 10. The plasma generation system can include a first power source 50 coupled to the process chamber 10, and configured to couple power to the process material in the process chamber 10. The first power source 50 may be a variable power source and may include a radio frequency (RF) generator and an impedance match network, and may further include an electrode through which RF power is coupled to the plasma in process chamber 10. The electrode can be formed in the upper assembly 30, and it can be configured to oppose the substrate holder 20. The impedance match network can be configured to optimize the transfer of RF power from the RF generator to the plasma by matching the output impedance of the match network with the input impedance of the process chamber, including the electrode, and plasma. For instance, the impedance match network serves to improve the transfer of RF power to plasma in plasma process chamber 10 by reducing the reflected power. Match network topologies (e.g. L-type, π-type, T-type, etc.) and automatic control methods are well known to those skilled in the art.

Alternatively, the first power source 50 may include a RF generator and an impedance match network, and may further include an antenna, such as an inductive coil, through which RF power is coupled to plasma in process chamber 10. The antenna can, for example, include a helical or solenoidal coil, such as in an inductively coupled plasma source or helicon source, or it can, for example, include a flat coil as in a transformer coupled plasma source.

Alternatively, the first power source 50 may include a microwave frequency generator, and may further include a microwave antenna and microwave window through which microwave power is coupled to plasma in process chamber 10. The coupling of microwave power can be accomplished using electron cyclotron resonance (ECR) technology, or it may be employed using surface wave plasma technology, such as a slotted plane antenna (SPA), as described in U.S. Pat. No. 5,024,716, entitled "Plasma processing apparatus for etching, ashing, and film-formation"; the contents of which are herein incorporated by reference in its entirety.

According to one embodiment of the invention, the PEALD system 1 includes a substrate bias generation system configured to generate or assist in generating a plasma (through substrate holder biasing) during at least a portion of the alternating introduction of the first process material and the second process material to process chamber 10. The substrate bias system can include a substrate power source 52 coupled to the process chamber 10, and configured to couple power to substrate 25. The substrate power source 52 may include a RF generator and an impedance match network, and may further include an electrode through which RF power is coupled to substrate 25. The electrode can be formed in substrate holder 20. For instance, substrate holder 20 can be electrically biased at a RF voltage via the transmission of RF power from a RF generator (not shown) through an impedance match network (not shown) to substrate holder 20. A typical frequency for the RF bias can range from about 0.1 MHz to about 100 MHz, and can be 13.56 MHz. RF bias systems for plasma processing are well known to those skilled in the art. Alternatively, RF power is applied to the substrate holder electrode at multiple frequencies.

Although the plasma generation system and the substrate bias system are illustrated in FIG. 1 as separate entities, they may indeed comprise one or more power sources coupled to substrate holder 20.

Still referring to FIG. 1, PEALD system 1 includes substrate temperature control system 60 coupled to the substrate holder 20 and configured to elevate and control the temperature of substrate 25. Substrate temperature control system 60 comprises temperature control elements, such as a cooling system including a re-circulating coolant flow that receives heat from substrate holder 20 and transfers heat to a heat exchanger system (not shown), or when heating, transfers heat from the heat exchanger system. Additionally, the temperature control elements can include heating/cooling elements, such as resistive heating elements, or thermo-electric heaters/coolers, which can be included in the substrate holder 20, as well as the chamber wall of the processing chamber 10 and any other component within the PEALD system 1.

In order to improve the thermal transfer between substrate 25 and substrate holder 20, substrate holder 20 can include a mechanical clamping system, or an electrical clamping system, such as an electrostatic clamping system, to affix substrate 25 to an upper surface of substrate holder 20. Furthermore, substrate holder 20 can further include a substrate backside gas delivery system configured to introduce gas to the back-side of substrate 25 in order to improve the gas-gap thermal conductance between substrate 25 and substrate holder 20. Such a system can be utilized when temperature control of the substrate is required at elevated or reduced temperatures. For example, the substrate backside gas system can comprise a two-zone gas distribution system, wherein the helium gas gap pressure can be independently varied between the center and the edge of substrate 25.

Furthermore, the process chamber 10 is further coupled to a pressure control system 32, including a vacuum pumping system 34 and a valve 36, through a duct 38, wherein the pressure control system 34 is configured to controllably evacuate the process chamber 10 to a pressure suitable for forming the thin film on substrate 25, and suitable for use of the first and second process materials. The vacuum pumping system 34 can include a turbo-molecular vacuum pump (TMP) or a cryogenic pump capable of a pumping speed up to about 5000 liters per second (and greater) and valve 36 can include a gate valve for throttling the chamber pressure. In conventional plasma processing devices utilized for dry plasma etch, a 300 to 5000 liter per second TMP is generally employed. Moreover, a device for monitoring chamber pressure (not shown) can be coupled to the processing chamber 10. The pressure measuring device can be, for example, a Type 628B Baratron absolute capacitance manometer commercially available from MKS Instruments, Inc. (Andover, Mass.).

Still referring to FIG. 1, controller 70 can comprise a microprocessor, memory, and a digital I/O port capable of generating control voltages sufficient to communicate and activate inputs to deposition system 1 as well as monitor outputs from PEALD system 1. Moreover, the controller 70 may be coupled to and may exchange information with the process chamber 10, substrate holder 20, upper assembly 30, first process material supply system 40, second process material supply system 42, purge gas supply system 44, first power source 50, second power source 52, substrate temperature controller 60, and pressure control system 32. For example, a program stored in the memory may be utilized to activate the inputs to the aforementioned components of the deposition system 1 according to a process recipe in order to perform an etching process, or a deposition process. One example of the controller 70 is a DELL PRECISION WORKSTATION 610™, available from Dell Corporation, Austin, Tex.

However, the controller 70 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 70, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the PEALD system 1, or it may be remotely located relative to the PEALD system 1. For example, the controller 70 may exchange data with the PEALD system 1 using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the deposition system 1 via a wireless connection.

Figure 2:
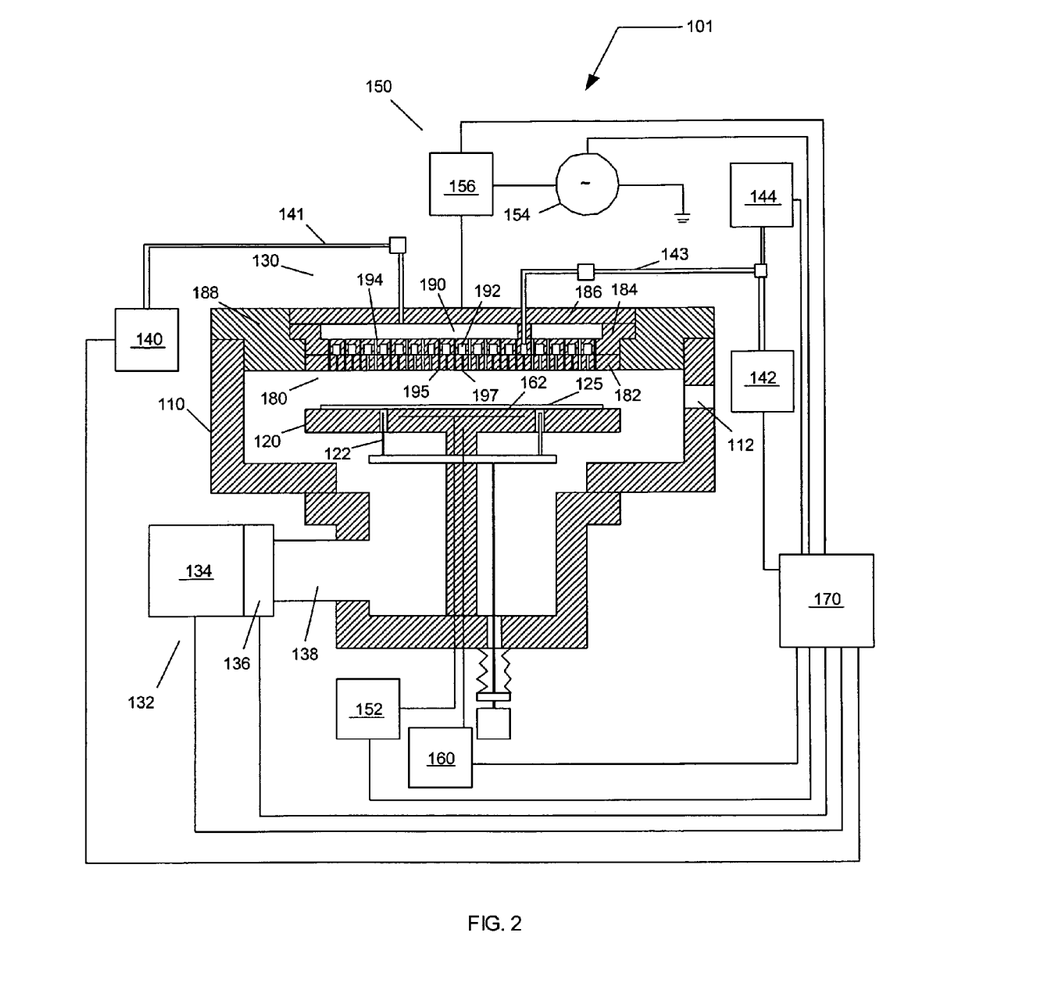
FIG. 2 depicts a schematic view of another PEALD system in accordance with an embodiment of the invention.

Referring now to FIG. 2, a PEALD system 101 is depicted. The PEALD system 101 comprises a process chamber 110 having a substrate holder 120 configured to support a substrate 125, upon which the thin TaC or TaCN film is formed. The process chamber 110 further comprises an upper assembly 130 coupled to a first process material supply system 140, a second process material supply system 142, and a purge gas supply system 144. Additionally, the deposition system 101 comprises a first power source 150 coupled to the process chamber 110 and configured to generate plasma in the process chamber 110, and a substrate temperature control system 160 coupled to substrate holder 120 and configured to elevate and control the temperature of substrate 125. Additionally, PEALD system 101 comprises a controller 170 that can be coupled to process chamber 110, substrate holder 120, upper assembly 130, first process material supply system 140, second process material supply system 142, purge gas supply system 144, first power source 150, and substrate temperature control system 160. The controller 170 may be implemented, for example, as the controller 70 described with respect to FIG. 1 above.

The PEALD system 101 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Substrates can be introduced to process chamber 110 through passage 112, and they may be lifted to and from an upper surface of substrate holder 120 via substrate lift system 122.

The first process material supply system 140 and the second process material supply system 142 are configured to alternately introduce a first process material to process chamber 110 and a second process material to process chamber 110. The alternation of the introduction of the first material and the introduction of the second material can be cyclical, or it may be acyclical with variable time periods between introduction of the first and second materials. The first process material can, for example, comprise a TaC or TaCN film precursor, such as a composition having the principal atomic or molecular species found in the film formed on substrate 125. For instance, the film precursor can originate as a solid phase, a liquid phase, or a gaseous phase, and it may be delivered to process chamber 110 in a gaseous phase, and with or without a carrier gas. The second process material can, for example, comprise a reducing agent, which may also have atomic or molecular species found in the film formed on substrate 125. For instance, the reducing agent can originate as a solid phase, a liquid phase, or a gaseous phase, and it may be delivered to process chamber 110 in a gaseous phase, and with or without a carrier gas.

According to one embodiment of the invention, the first process material and the second process material are chosen in accordance with the elemental composition and characteristics of the TaCN film to be deposited on the substrate. The first process material can include a Ta organic film precursor containing a "Ta—N—C" structural unit, such as tertiary amyl imido-tris-dimethylamido tantalum $(Ta(NC(CH_3)_2C_2H_5)(N(CH_3)_2)_3$, hereinafter referred to as TAIMATA®; for additional details, see U.S. Pat. No. 6,593,484, the entire contents of which is incorporated herein by reference). In another example, the first process material can include (pentakis(diethylamido)tantalum $(Ta[N(C_2H_5)_2]_5$, PDEAT), pentakis(ethylmethylamido)tantalum $(Ta[N(C_2H_5CH_3)]_5$, PEMAT), pentakis(dimethylamido)tantalum $(Ta[N(CH_3)_2]_5$, PDMAT), (t-butylimino tris(diethylamino) tantalum $(Ta(NC(CH_3)_3)(N(C_2H_5)_2)_3$, TBTDET), $Ta(NC_2H_5)(N(C_2H_5)_2)_3$, $Ta(NC(CH_3)_2C_2H_5)(N(CH_3)_2)_3$, $Ta(NC(CH_3)_3)(N(CH_3)_2)_3$, or tert-butyl-tris-ethylmethylamido tantalum $((CH_3)_3CNTa(NC_2H_5(CH_3)_3)_3)$, TBTEMAT).

According to an embodiment of the invention, the second process material can include a reducing agent, such as hydrogen $(H_2)$ gas, ammonia $(NH_3)$, $N_2H_4$, $NH(CH_3)_2$, $N_2H_3CH_3$, silane $(SiH_4)$, or disilane $(Si_2H_6)$, or a combination of more than one thereof.

Additionally, the purge gas supply system 144 can be configured to introduce a purge gas to process chamber 110. For example, the introduction of purge gas may occur between introduction of the first process material and the second process material to process chamber 110, or following the introduction of the second process material to process chamber 110, respectively. The purge gas can comprise an inert gas, such as a noble gas (i.e., helium, neon, argon, xenon, krypton), or nitrogen $(N_2)$, or hydrogen $(H_2)$.

The first material supply system 140, the second material supply system 142, and the purge gas supply system 144 can include one or more material sources, one or more pressure control devices, one or more flow control devices, one or more filters, one or more valves, or one or more flow sensors. As discussed with respect to FIG. 1, the flow control devices can include pneumatic driven valves, electromechanical (solenoidal) valves, and/or high-rate pulsed gas injection valves. An exemplary pulsed gas injection system is described in greater detail in pending U.S. application 60/272,452, filed on Mar. 2, 2001, which is incorporated herein by reference in its entirety.

Referring still to FIG. 2, the first process material is coupled to process chamber 110 through first material line 141, and the second process material is coupled to process chamber 110 through second material line 143. Additionally, the purge gas may be coupled to process chamber 110 through the first material line 141 (not shown), the second material line 143 (as shown), or an independent line, or any combination thereof. In the embodiment of FIG. 2, the first process material, second process material, and purge gas are introduced and distributed within process chamber 110 through the upper assembly 130 that includes gas injection assembly 180. While not shown in FIG. 2, a sidewall gas injection valve may also be included in the processing system. The gas injection assembly 180 may comprise a first injection plate 182, a second injection plate 184, and a third injection plate 186, which are electrically insulated from process chamber 110 by insulation assembly 188. The first process material is coupled from the first process material supply system 140 to process chamber 110 through a first array of through-holes 194 in the second injection plate 184 and a first array of orifices 195 in the first injection plate 182 via a first plenum 190 formed between the second injection plate 184 and the third injection plate 186. The second process material, or purge gas, or both is coupled from the second process material supply system 142 or purge gas supply system 144 to process chamber 110 through a second array of orifices 197 in the first injection plate 182 via a second plenum 192 formed in the second injection plate 184.

Referring still to FIG. 2, the PEALD system 101 comprises a plasma generation system configured to generate a plasma during at least a portion of the alternating and cyclical introduction of the first process material and the second process material to process chamber 110. The plasma generation system can include a first power source 150 coupled to the process chamber 110, and configured to couple power to the first process material, or the second process material, or both in process chamber 110. The first power source 150 may be variable and includes a RF generator 154 and an impedance match network 156, and further includes an electrode, such as gas injection assembly 180, through which RF power is coupled to plasma in process chamber 110. The electrode is formed in the upper assembly 130 and is insulated from process chamber 110 via insulation assembly 188, and it can be configured to oppose the substrate holder 120. The RF frequency can, for example, range from approximately 100 kHz to approximately 100 MHz. Alternatively, the RF frequency can, for example, range from approximately 400 kHz to approximately 60 MHz. By way of further example, the RF frequency can, for example, be approximately 27.12 MHz or 13.56 MHz.

According to one embodiment of the invention, the PEALD system 101 includes a substrate bias generation system configured to generate or assist in generating a plasma (through substrate holder biasing) during at least a portion of the alternating introduction of the first process material and the second process material to process chamber 110. The substrate bias system can include a substrate power source 152 coupled to the process chamber 110, and configured to couple power to substrate 125. The substrate power source 152 may include a RF generator and an impedance match network, and may further include an electrode 162 through which RF power is coupled to substrate 125. The electrode 162 can be formed in substrate holder 120. For instance, substrate holder 120 can be electrically biased at a RF voltage via the transmission of RF power from a RF generator (not shown) through an impedance match network (not shown) to substrate holder 120. A typical frequency for the RF bias can range from about 0.1 MHz to about 100 MHz. RF bias systems for plasma processing are well known to those skilled in the art. Alternatively, RF power is applied to the substrate holder electrode at multiple frequencies.

Still referring to FIG. 2, PEALD system 101 includes temperature control system 160 coupled to the substrate holder 120 and configured to elevate and control the temperature of substrate 125. Substrate temperature control system 160 comprises at least one temperature control element, including a resistive heating element such as an aluminum nitride heater. The substrate temperature control system 160 can, for example, be configured to elevate and control the substrate temperature from room temperature to approximately 350° C. to 400° C. Alternatively, the substrate temperature can, for example, range from approximately 150° C. to 350° C. It is to be understood, however, that the temperature of the substrate is selected based on the desired temperature for causing PEALD deposition of a particular material on the surface of a given substrate. Therefore, the temperature can be higher or lower than described above. However, if the substrate temperature is too high, CVD growth may be observed instead of PEALD growth. In the example of TAIMATA, a substrate temperature equal to or below about 240° C. may be selected to achieve PEALD growth.

Furthermore, the process chamber 110 is further coupled to a pressure control system 132, including a vacuum pumping system 134 and a valve 136, through a duct 138, wherein the pressure control system 132 is configured to controllably evacuate the process chamber 110 to a pressure suitable for forming the thin film on substrate 125, and suitable for use of the first and second process materials.

Figure 3:
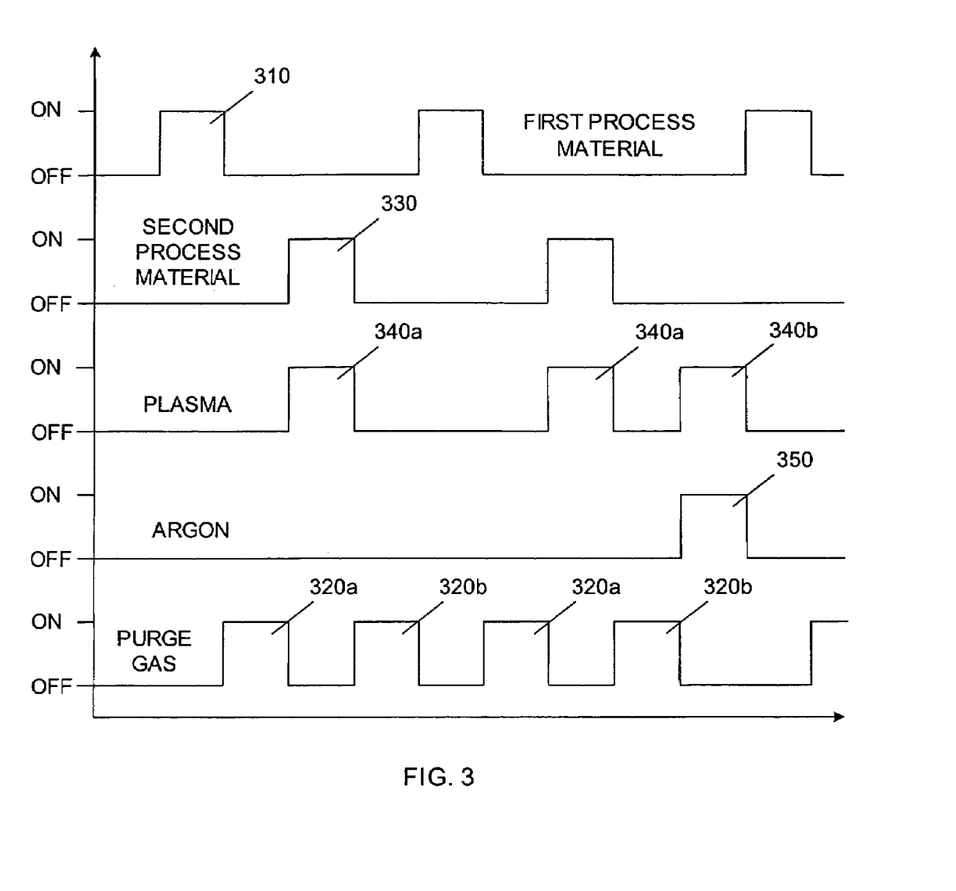
FIG. 3 is a timing diagram for an PEALD process for forming a TaC or TaCN film in accordance with an embodiment of the invention.

FIG. 3 is a timing diagram for an PEALD process for forming a TaC or TaCN film in accordance with an embodiment of the invention. The PEALD process can, for example, be performed in the process chamber 10, 110 of PEALD system 1, 101 shown in FIG. 1, 2. In FIG. 3, a first process material containing tantalum is introduced to process chamber 10/110 for time period 310 in order to cause adsorption of the tantalum film precursor on exposed surfaces of substrate 25/125, then the process chamber 10/110 is purged with a purge gas for a time period 320a. Thereafter, a second process material (reducing agent), is introduced to process chamber 10/110 for a time period 330 while power is coupled in a plasma through the upper assembly 30/130, the substrate holder 20/120, or both, to the reducing agent as shown by time period 340a. The coupling of power to the reducing agent heats the reducing agent, thus causing ionization and/or dissociation of the reducing agent in order to form radicals and/or ions that chemically react with the first process material adsorbed on substrate 25/125. When substrate 25/125 is heated to an elevated temperature, the surface chemical reaction facilitates the formation of the desired TaC or TaCN film. Thereafter, the process chamber 10/110 is purged with a purge gas for a time period 320b. In the exemplary embodiment shown in FIG. 3, introduction of the first process material, purge, introduction of the second process material in the presence of plasma, and purge, is performed twice before Argon is flowed into the process chamber for a time period 340 while power is coupled in a plasma to the Argon and the substrate 25/125 is exposed to plasma excited Argon gas for a time period 350.

Still referring to FIG. 3, in one example, a TaCN film was deposited using TAIMATA as the first process material, $H_2$ as the second process material, and Argon as the purge gas. The length of time periods 310, 320a, 320b, 330, 340a, 340b, and 350, was 3 sec, 1 sec, 3 sec, 10 sec, 10 sec, 60 sec, and 60 sec, respectively.

According to embodiments of the invention, introduction of the first process material, purge, introduction of the second process material in the presence of plasma, and purge, may be repeated a desired number of times before the substrate 25/125 is exposed to plasma excited Argon gas. For example, the steps of introducing the first process material, purging, introducing the second process material in the presence of plasma, and purging, may be performed between 2 and 100 times, or between 30 and 70 times, prior the exposing the substrate 25/125 to plasma excited Argon. Furthermore, according to an embodiment of the invention, a process sequence that includes introducing the first process material, purging, introducing the second process material in the presence of plasma, and purging, repeated a desired number of times, followed by exposing the substrate 25/125 to plasma excited Argon, may be repeated any number of times. For example, the process sequence may be repeated between 1 and 100 times, or between 10 and 20 times, to produce a TaC or TaCN film with a desired thickness on the substrate 25/125.

Although the second process material time period 330 and the plasma time period 340 are shown in FIG. 3 to exactly correspond to one another, it is sufficient for purposes of embodiments of the present invention that such time periods merely overlap, as would be understood by one of ordinary skill in the art.

Figure 4:
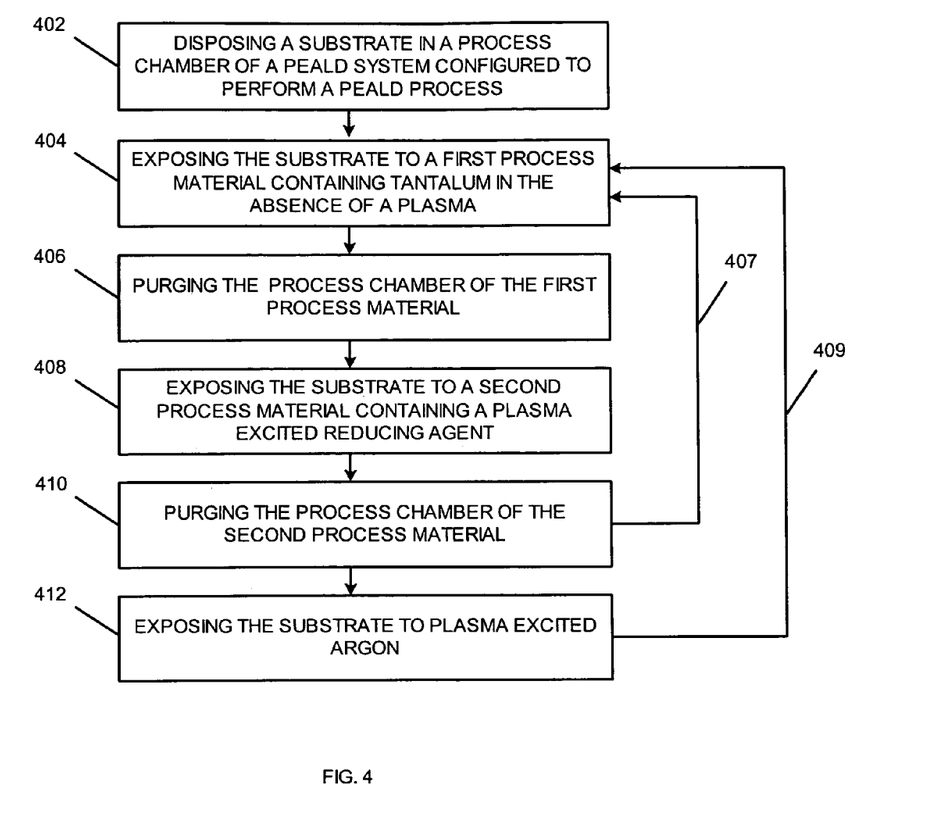
FIG. 4 shows a process flow diagram of an PEALD process for forming a TaC or TaCN film in accordance with an embodiment of the invention.

Reference will now be made to FIGS. 3 and 4. FIG. 4 shows a process flow diagram of a PEALD process in accordance with an embodiment of the present invention. Further, while FIG. 3 shows no plasma generation during introduction of the first process material, a plasma may be generated during a portion or all this time, for example, to assist in the adsorption process. Finally, while the process of FIG. 3 preferably includes the purge steps shown, this is not necessary to the present invention of the PEALD process generally.

FIG. 4 shows a process flow diagram of an PEALD process for forming a TaC or TaCN film in accordance with an embodiment of the present invention. The process flow of FIG. 4 may be performed by the PEALD systems of FIGS. 1 or 2, or any other suitable PEALD system configured to perform a PEALD process. As seen in FIG. 4, the PEALD process begins when a substrate 25/125, such as a semiconductor substrate, is disposed in a process chamber 10/110 in step 402.

In step 404, the substrate 25/125 is exposed to a first process material containing tantalum in the absence of a plasma for a time period 310. As noted above, in some embodiments of the invention, a plasma may be generated during introduction of the first process material. The first process material can be a chemically volatile but thermally stable material that can be deposited on the substrate surface in a self limiting manner. The first process material can include TAIMATA, PDEAT, PEMAT, PDMAT, TBTDET, $Ta(NC_2H_5)(N(C_2H_5)_2)_3$, $Ta(NC(CH_3)_2C_2H_5)(N(CH_3)_2)_3$, or $Ta(NC(CH_3)_3)(N(CH_3)_2)_3$ for depositing a TaCN film. Alternatively, the first process material can include $Ta(\eta^5-C_5H_5)_2H_3$, $Ta(CH_2)(CH_3)(\eta^5-C_5)_2$, $Ta(\eta^3-C_3H_5)(\eta^5-C_5H_5)_2$, $Ta(CH_3)_3(\eta^5-C_5H_5)_2$, $Ta(CH_3)_4(\eta^5-C_5(CH_3)_5)$, or $Ta(\eta^5-C_5(CH_3)_5)_2H_3$ for depositing a TaC film. The first process material may be delivered "neat" (undiluted by a carrier gas) to the process chamber or a carrier gas may be used to dilute the first process material. The carrier gas can, for example, include Argon or $N_2$. According to one embodiment of the invention, the first process material can be undiluted TAIMATA that is vaporized from TAIMATA liquid.

In step 406, the process chamber is purged of the first process material for a time period 320a. The purge step 406 allows the first process material to be exhausted from the PEALD process chamber by vacuum pumping prior to introduction of the second process material. The purging may include flowing a purge gas, for example Ar or $N_2$, into the process chamber.

In step 408, the substrate is exposed to a second process material comprising a plasma excited reducing agent. According to an embodiment of the invention, the reducing agent can include hydrogen ($H_2$) gas, ammonia ($NH_3$), $N_2H_4$, $NH(CH_3)_2$, $N_2H_3CH_3$, silane ($SiH_4$), or disilane ($Si_2H_6$), or a combination of more than one thereof. The second process material may be delivered undiluted to the process chamber or a carrier gas may be used to dilute the second process material. The carrier gas can, for example, include Argon or $N_2$. According to one embodiment of the invention, the reducing agent can be undiluted $H_2$.

In step 408, the plasma excitation of the second process material heats the reducing agent, thus causing ionization and/or dissociation of the reducing agent in order to form radicals and/or ions that chemically react with the first precursor adsorbed on the substrate to facilitate the reduction process and reduce impurities within the deposited film. In an embodiment of the invention, the substrate holder bias can be between 100 W and 2000 W, or between 100 W and 500 W, while the upper assembly (electrode) 30,130 is grounded. However, the actual substrate holder bias may vary depending on factors such as the composition and characteristics of the TaC or TaCN film to be deposited. Suitable high power levels that enable PEALD deposition of a TaC or TaCN film at improved deposition speeds and with reduced impurities in accordance with an embodiment of the invention can be determined by direct experimentation and/or design of experiments (DOE). Other adjustable process parameters such as substrate temperature, process pressure, type of first and second process materials and relative gas flows can also be determined by direct experimentation and/or design of experiments (DOE).

In step 410, the process chamber is purged of the second process material for a time period 320b. The purging may include flowing a purge gas, for example Ar or $N_2$, into the process chamber. Similarly, where multiple PEALD cycles are executed, a purge gas can be introduced after the reduction reaction takes place to expel the second process material before introduction of the first process material. This purging ensures that the reduction reaction occurs primarily at the adsorbed layer of the first process material on the substrate, rather than in the process chamber atmosphere prior to being deposited.

The reduction reaction completed by step 408 results in a thin layer of a TaC or TaCN being deposited on the substrate surface. The thin layer can have a thickness of about one atomic layer, or less. Once the reduction reaction takes place, steps 404, 406, 408, 410 can be repeated a desired number of times as shown by process flow 407 to deposit additional TaC or TaCN layers of the substrate.

In step 412, the TaC or TaCN layers from steps 404, 406, 408, 410, repeated a desired number of times, is exposed to plasma excited Argon for a time period 350. The present inventors have recognized that the PEALD process described in FIG. 3 and 4 can form TaC or TaCN films with good film properties and improved adhesion to Cu layers. In particular, the exposure of the TaC or TaCN film to plasma excited Argon in step 412 greatly improves adhesion to a Cu metal seed layer deposited on the TaC or TaCN film for subsequent metallization. It is contemplated that the improved adhesion may be due to removal of surface contamination such as carbon (C), nitrogen (N), oxygen (O), or water ($H_2O$) from the Tac or TaCN film, generation of free (active) Ta sites on the film, atomic level roughening of the TaC or TaCN film, increase in the density of the TaC or TaCN film, increase in the crystallinity of the TaC or TaCN film, or a combination of two or more thereof. More generally, as Argon gas atoms are relatively heavy, the present inventors believe that an Argon plasma in contact with the deposited film can physically change the film in a way that improves adhesion properties of the film.

In a preferred embodiment, the Argon plasma step 412 is performed within the process chamber as shown by FIGS. 3 and 4. However, where the Argon plasma step 412 is to be performed after the PEALD deposition process is complete, then the Argon plasma may be performed in a separate chamber. For example, a plurality of intermittent Argon plasma steps may be performed in the process chamber throughout the PEALD growth cycles. Then the substrate having the TaC or TaCN film thereon can be transferred to an iPVD chamber for a final Argon plasma step followed by deposition of a copper film. Still further, the TaC or TaCN film can be treated in the PEALD, iPVD or other chamber with plasma excited hydrogen or atomic hydrogen as disclosed in co-pending U.S. patent application Ser. No. 11/378,263, titled "Method of Integrating PEALD Ta-Containing films into Cu metallization," filed on even date herewith and having.

According one embodiment of the invention, at least one of steps 408 and 412 include applying substrate holder bias between 100 W and 2000 W, or between 100 W and 500 W.

Next, the TaC or TaCN film deposition may be repeated a desired number of times as shown by process flow 409 to deposit a TaC or TaCN film with a desired thickness. For example, the TaC or TaCN film can have a thickness between 1 nm and 20 nm, between 1 nm and 10 nm, or between 1 nm and 5 nm. According to one embodiment of the invention, the TaC or TaCN film can have a thickness of about 3 nm.

Figure 5:
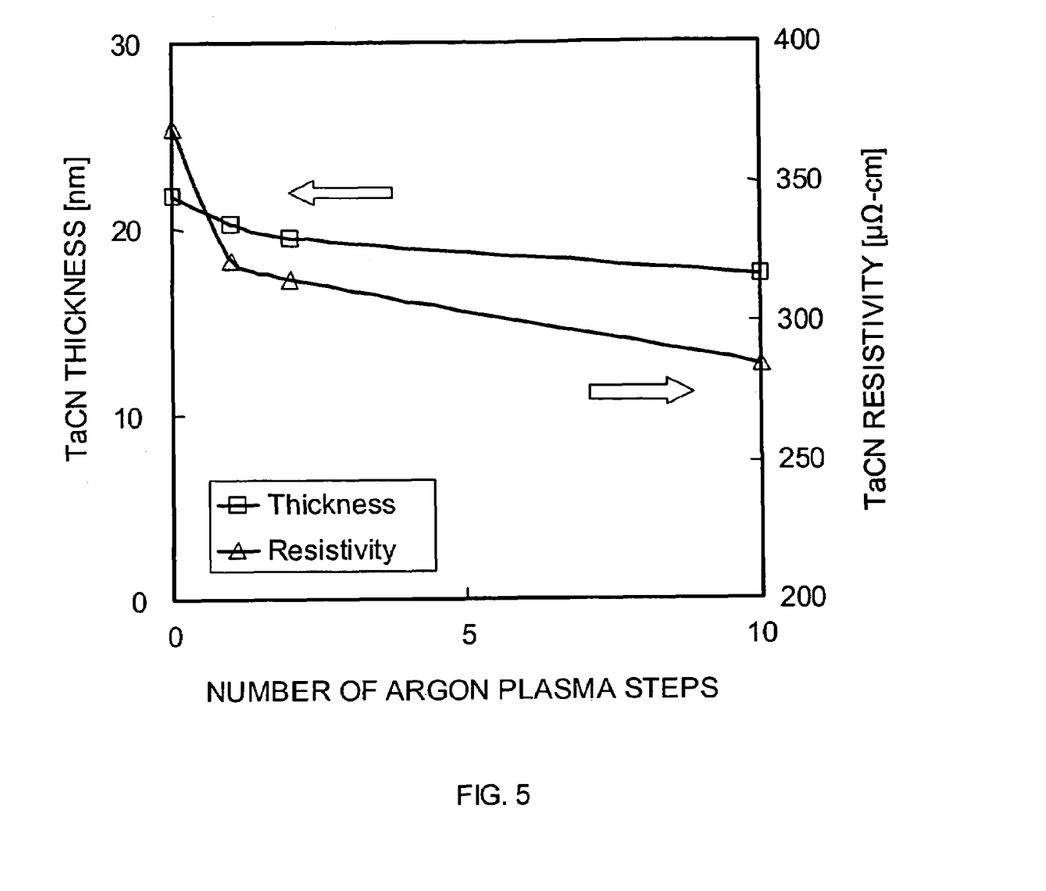
FIG. 5 presents process data for forming a TaCN film by a PEALD process according to an embodiment of the invention.

FIG. 5 presents PEALD process data for forming a TaCN film according to an embodiment of the invention. FIG. 5 shows TaCN film thickness and TaCN film resistivity as a function of the number of exposures to plasma excited Ar (step 412 of FIG. 4). The TaCN films were deposited using undiluted TAIMATA as a first processing material in step 404 of FIG. 4, undiluted $H_2$ as the second processing material in step 408, undiluted Argon purge gas in steps 406 and 408, and undiluted Argon in plasma exposure step 412. The TaCN films were deposited using 300 cycles of steps 404, 406, 408, 410, where step 412 was carried out 0, 1, 2, or 10 times (see FIGS. 3 and 4) during the 300 Cycles. Where multiple plasma exposure steps 412 were performed, they were performed at substantially equal intervals in the 300 cycle process.

As seen in FIG. 5, the TaCN film thickness was relatively insensitive to the number of times step 412 was performed; the TaCN film thickness varied from 22 nm (step 412 not performed) to 18 nm for ten 412 steps, or about 18% reduction. The TaCN film resistivity was reduced from 370 µOhm-cm to 280 µOhm-cm, or about 25%. This reduction in resistivity can provide improved device performance. It is contemplated that the reduction in the TaCN film resistivity may at least in part be due to removal of surface contamination, increase in the density of the TaCN film, increase in the crystallinity of the TaCN film, or a combination of two or more thereof.

The adhesion and agglomeration of Cu layers to TaCN films deposited according to embodiments of the invention was also measured. TaCN films of approximately 3 nm were deposited using 51 exposure cycles (one cycle includes steps 404, 406, 408, 410) at substrate temperature of 240° C., and using 40 exposure cycles at substrate temperature of 170° C., each with a substrate holder bias of 500 W in step 408. Each TaCN film was then exposed once to plasma excited Ar (step 412), using an Argon flow of 1,000 sccm, an exposure time of 60 sec, a process chamber pressure of 0.5 Torr, and a substrate holder bias of 100 W, 300 W, or 500 W. Next, a 10 nm thick Cu layer was deposited on the TaCN films by i-PVD. Subsequently, the substrate was annealed for 30 min at a substrate temperature of 400° C. in the presence of 10 Torr of Argon to evaluate the adhesion properties of the TaCN films to Cu. The annealing showed that TaCN films deposited at 170° C. and exposed to plasma excited Argon at a substrate holder bias of 100 W had improved adhesion to Cu, as shown by lack of Cu agglomeration visible by scanning electron microscopy (SEM). Furthermore, TaCN films deposited at 240° C. and exposed to plasma excited Argon at substrate holder bias of 500 W had improved adhesion to Cu.

Although only certain exemplary embodiments of inventions have been described in detail above, those skilled in the art will readily appreciate that many modifications are possible in the exemplary embodiments without materially departing from the novel teachings and advantages of this invention. Accordingly, all such modifications are intended to be included within the scope of this invention.

The invention claimed is:

1. A method for processing a substrate comprising:
   disposing said substrate in a process chamber of a plasma enhanced atomic layer deposition (PEALD) system configured to perform a PEALD process; and
   depositing a TaC or TaCN film on said substrate using said PEALD process, wherein the depositing comprises:
   (a) exposing said substrate to a first process material comprising tantalum;
   (b) exposing said substrate to a second process material comprising a plasma excited reducing agent,
   (c) repeating steps (a) and (b) a predetermined number of times,
   (d) after step (c) exposing the substrate to plasma excited Argon, and
   (e) repeating steps (c) and (d) until the TaC or TaCN film has a desired thickness.

2. The method of claim 1, further comprising purging said process chamber after each of steps (a) and (b).

3. The method of claim 2, wherein said predetermined number is between 2 and 100 times.

4. The method of claim 2, wherein said predetermined number is between 30 and 70 times.

5. The method of claim 2, wherein step (e) is performed between 1 and 100 times.

6. The method of claim 2, wherein step (e) is performed between 10 and 20 times.

7. The method of claim 2, wherein the depositing comprises depositing a TaCN film and the first process material comprises TAIMATA, PDEAT, PEMAT, PDMAT, TBTDET, $Ta(NC_2H_5)(N(C_2H_5)_2)_3$, $Ta(NC(CH_3)_2C_2H_5)(N(CH_3)_2)_3$, $Ta(NC(CH_3)_3)(N(CH_3)_2)_3$, or TBTEMAT.

8. The method of claim 2, wherein the depositing comprises depositing a TaC film and the first process material comprises $Ta(\eta^5\text{-}C_5H_5)_2H_3$, $Ta(CH_2)(CH_3)(\eta^5\text{-}C_5H_5)_2$, $Ta(\eta^3\text{-}C_3H_5)(\eta^5\text{-}C_5H_5)_2$, $Ta(CH_3)_3(\eta^5\text{-}C_5H_5)_2$, $Ta(CH_3)_4(\eta^5\text{-}C_5(CH_3)_5)$, or $Ta(\eta^5\text{-}C_5(CH_3)_5)_2H_3$.

9. The method of claim 2, wherein the second process material comprises as $H_2$, $NH_3$, $N_2H_4$, $NH(CH_3)_2$, $N_2H_3CH_3$, $SiH_4$, or $Si_2H_6$, or a combination of two or more thereof.

10. The method of claim 2, wherein the purging steps comprise flowing a purge gas through the process chamber, wherein the purge gas comprises a noble gas, $N_2$, or $H_2$, or a combination of two or more thereof.

11. The method of claim 2, wherein step (b) comprises flowing undiluted $H_2$ gas into the process chamber and exposing said substrate to plasma excited $H_2$.

12. The method of claim 2, wherein step (d) comprises flowing undiluted Argon gas into the process chamber and exposing said substrate to the plasma excited Argon.

13. The method of claim 2, wherein at least one of steps (b) and (d) comprise applying substrate holder bias.

14. The method of claim 13, wherein the substrate holder bias is between 100 and 2000 W.

15. The method of claim 13, wherein the substrate holder bias is between 100 and 500 W.

16. The method of claim 2, wherein step (a) is performed in the absence of a plasma.

17. A method for processing a substrate comprising:
disposing said substrate in a process chamber of a plasma enhanced atomic layer deposition (PEALD) system configured to perform a PEALD process; and
depositing a TaCN film on said substrate using said PEALD process, wherein the depositing comprises:
(a) exposing said substrate to a first process material comprising TAIMATA,
(b) purging said process chamber of the first process material,
(c) exposing said substrate to a second process material comprising plasma excited $H_2$,
(d) purging said process chamber of the second process material,
(e) repeating steps (a)-(d) a predetermined number of times,
(f) exposing the substrate to plasma excited Argon, and
(g) repeating steps (a)-(f) until the TaCN film has a desired thickness.

18. The method of claim 17, wherein step (a) comprises flowing undiluted TAIMATA gas into the process chamber and exposing said substrate to TAIMATA in the absence of a plasma.

19. The method of claim 17, wherein step (c) comprises flowing undiluted $H_2$ gas into the process chamber and exposing said substrate to plasma excited $H_2$.

20. The method of claim 17, wherein step (f) comprises flowing undiluted Argon gas into the process chamber and exposing said substrate to the plasma excited Argon.

21. The method of claim 17, wherein the purging steps (b) and (d) comprise flowing a purge gas through the process chamber, wherein the purge gas comprises a noble gas, $N_2$, or $H_2$, or a combination of two or more thereof.

22. The method of claim 17, wherein steps (a)-(d) are performed between 2 and 100 times.

23. The method of claim 17, wherein steps (a)-(f) are performed between 1 and 100 times.

24. The method of claim 17, wherein at least one of steps (c) and (f) comprise applying substrate holder bias.

25. The method of claim 17, wherein the substrate holder bias is between 100 and 500 W.

26. The method of claim 17, wherein the substrate holder bias is between 100 and 2000 W.

27. The method of claim 17, wherein the substrate is maintained at a temperature of 240° C. or less in step (a).

* * * * *